(12) United States Patent
Huang

(10) Patent No.: US 8,351,195 B2
(45) Date of Patent: Jan. 8, 2013

(54) MULTIFUNCTIONAL UNIVERSAL SERIAL BUS FLASH DRIVE ORGANIZER

(75) Inventor: Kenneth Huang, Houston, TX (US)

(73) Assignee: Microlan Integration, Inc., Houston, TX (US)

( * ) Notice: Subject to any disclaimer, the term of this patent is extended or adjusted under 35 U.S.C. 154(b) by 185 days.

(21) Appl. No.: 13/024,730

(22) Filed: Feb. 10, 2011

(65) Prior Publication Data

US 2012/0206874 A1  Aug. 16, 2012

(51) Int. Cl.
*G06F 1/16* (2006.01)
(52) U.S. Cl. ........... 361/679.31; 361/679.32; 361/679.4; 206/45.23; 206/206
(58) Field of Classification Search ............. 361/679.31, 361/679.32
See application file for complete search history.

(56) References Cited

U.S. PATENT DOCUMENTS

| | | | |
|---|---|---|---|
| 5,295,089 A * | 3/1994 | Ambasz .................. | 361/679.09 |
| 5,423,363 A * | 6/1995 | Matzdorff et al. ............ | 150/143 |
| 6,926,544 B2 * | 8/2005 | Lee ............................... | 439/147 |
| 7,359,183 B2 * | 4/2008 | Wu et al. ................... | 361/679.01 |
| 2006/0238507 A1 * | 10/2006 | Chang ........................... | 345/163 |
| 2011/0228465 A1 * | 9/2011 | Wu ............................ | 361/679.31 |
| 2011/0304971 A1 * | 12/2011 | Kelley et al. ............. | 361/679.31 |
| 2012/0106066 A1 * | 5/2012 | Zhang et al. ............. | 361/679.32 |
| 2012/0120585 A1 * | 5/2012 | Yu et al. .................... | 361/679.32 |

* cited by examiner

*Primary Examiner* — Anthony Q Edwards
(74) *Attorney, Agent, or Firm* — Muncy, Geissler, Olds & Lowe, PLLC

(57) ABSTRACT

A multifunctional USB flash drive organizer includes a main unit, an interior of which is provided with a containing chamber to put USB flash drives. A side of the containing chamber is pivoted with USB sockets which can turn and a wire containing slot is provided beside the containing chamber. The main unit is provided with a wire collection device and a USB connector, with that a connection cable of the USB connector is electrically interconnected with the wire collection device. In addition, multiple USB flash drives can all operate at a same time. A wallet unit encloses the main unit as a box which is convenient in labeling for drive management and can be carried easily.

6 Claims, 5 Drawing Sheets

MULTIFUNCTIONAL UNIVERSAL SERIAL BUS FLASH DRIVE ORGANIZER

BACKGROUND OF THE INVENTION a) Field of the Invention

The present invention relates to a USB (Universal Serial Bus) flash drive organizer, and more particularly to a multifunctional Universal Serial Bus flash drive organizer which is installed in a wallet unit to be carried easily, that multiple USB flash drives can be labeled for management and can all be operated at the same time.

b) Description of the Prior Art

With the popularity of USB flash drives, a user usually carries multiple flash drives. Common ways of carrying the flash drives are putting in a pocket or hanging around the neck like a necklace, where the user will try his or her best to prevent the flash drives from getting lost or damaged.

In addition, using conventional USB interface, there is a limit to the number of USB ports on a computer which are also used by other peripheral equipment. The single USB socket only provides for insertion of a single USB flash drive that the USB flash drive must be removed for replacement every time when the replacement is needed, which is not in compliance with operational convenience and economic benefits. Also, the USB flash drives can be lost easily and hard to be managed.

SUMMARY OF THE INVENTION

The primary objective of the present invention is to provide a multifunctional Universal Serial Bus flash drive organizer with a protective casing unit. With that, the multifunctional Universal Serial Bus flash drive organizer can provide for electrical interconnection with USB port from a computer and can provide a containing chamber for the flash drives, thereby achieving the following functions: ease of carrying, protection, drive management, and able to operate multiple USB flash drives at the same time.

To achieve the abovementioned objectives, the present invention includes:
 a main unit that the interior provides a containing chamber for USB flash drives and a cable slot for a USB cable and the caps of USB flash drives. Inside the containing chamber is a series of pivoting USB sockets. These sockets can turn and the interior of the main unit also contains a wiring collection device to all sockets.
 a wallet unit which encloses the main unit as well as a USB connector, USB sockets, the cable slot, the containing chamber and USB flash drives inside the main unit to form the multifunctional Universal Serial Bus flash drive organizer; and
 a USB connector which is provided with a connection cable, wherein the USB connector is electrically interconnected with the wiring collection device through the connection cable, thereby being electrically interconnected with a computer.

When a user is to operate the organizer, the user first electrically connects the USB connector with the computer. Next, the user turns the USB socket outward from the containing space, and then connects the USB flash drive with the USB socket that the USB flash drive can be identified and accessed by the computer through the wire collection device. At this time, a cap which is removed from the USB flash drive can be stored in the cable containing slot of the main unit.

In an embodiment, the main unit is roughly a rectangular body.

In an embodiment, the USB socket can turn by 180°.

In an embodiment, a side of the containing chamber is concaved with curved pick-up slots.

In an embodiment, the wallet unit includes a fixed panel, a side panel and a movable panel.

In an embodiment, the movable panel of the wallet unit is provided with an internal pocket toward the inner surface of the containing chamber, allowing the user to put an index of contents of the flash drives or name cards.

In an embodiment, the USB connector can be contained in the cable containing slot of the main unit.

In an embodiment, the main unit can be provided with a luminous element which is electrically interconnected with the wire collection device, such that when the USB connector is interconnected with the computer, the wire collection device can illuminate through the luminous element, allowing a state of connection and access to be identified from outside.

To enable a further understanding of the said objectives and the technological methods of the invention herein, the brief description of the drawings below is followed by the detailed description of the preferred embodiments.

DETAILED DESCRIPTION OF THE PREFERRED EMBODIMENTS

Figure 1:
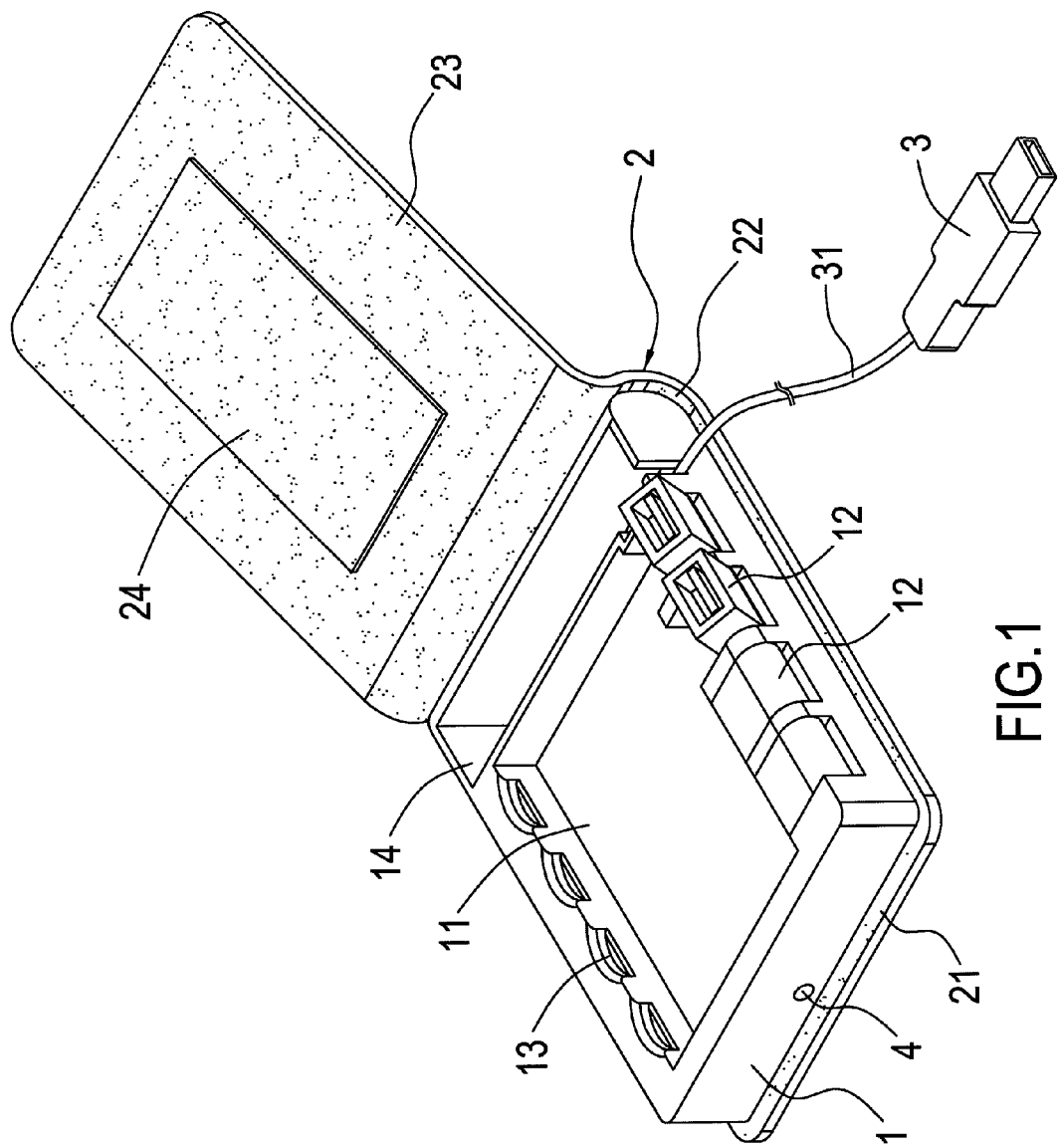
FIG. 1 shows a three-dimensional structural view of a wallet unit of a multifunctional Universal Serial Bus flash drive organizer of the present invention, wherein the wallet unit is opened.
Figure 2:
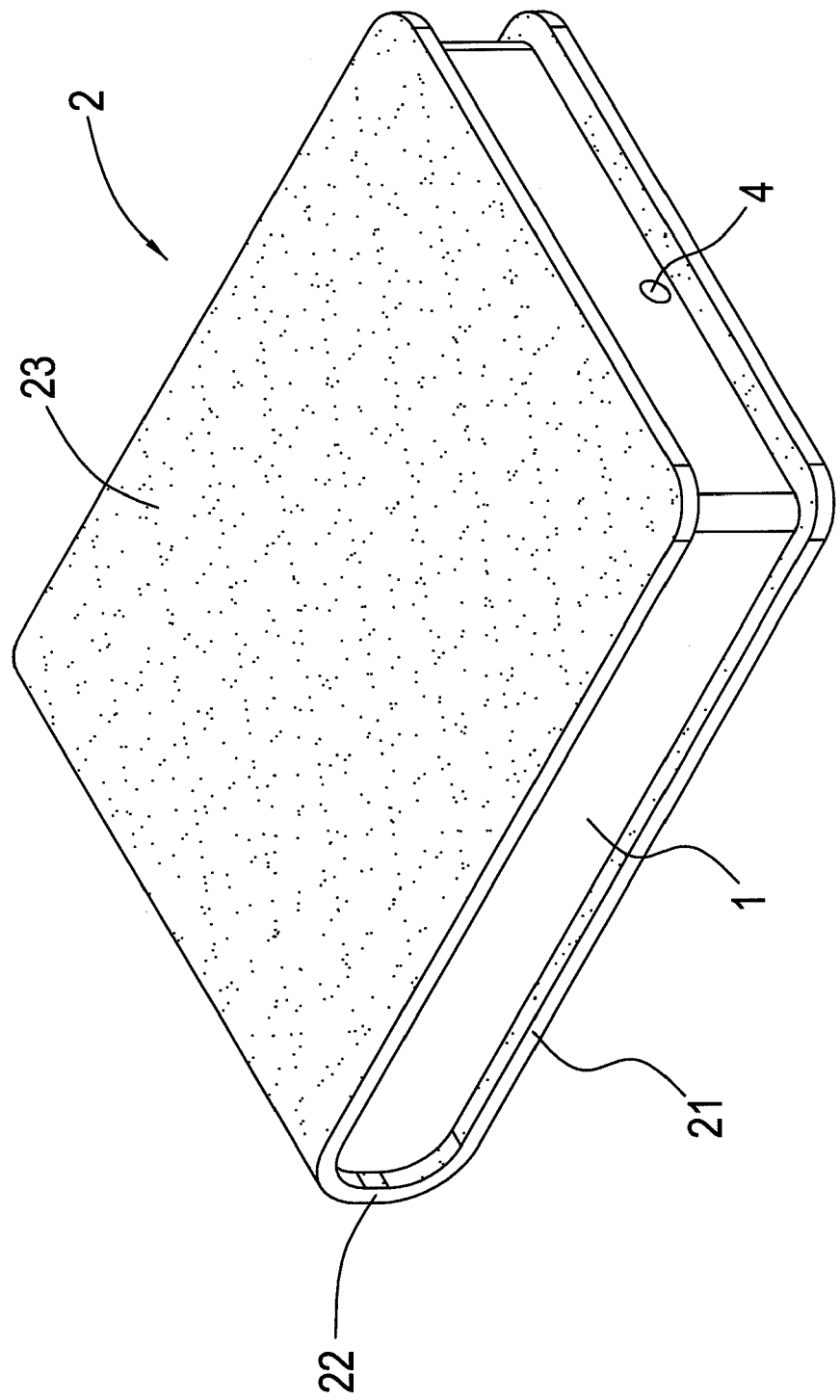
FIG. 2 shows a three-dimensional structural view of the wallet unit of the multifunctional Universal Serial Bus flash drive organizer of the present invention, wherein the wallet unit is closed.

Referring to FIG. 1 and FIG. 2, one shows a three-dimensional structural view of a wallet unit of the multifunctional Universal Serial Bus flash drive organizer of the present invention, wherein the wallet unit is opened; and another shows a three-dimensional structural view of the wallet unit of the multifunctional Universal Serial Bus flash drive organizer of the present invention, wherein the wallet unit is closed. The present invention comprises of:
 a main unit (1) which is roughly a rectangular body and an interior of space is formed with a containing chamber (11) to contain USB flash drives, wherein a side of the containing chamber (11) is pivoted with USB sockets (12) such that the USB sockets (12) can rotate on the axial by 180° from the interior to exterior of the containing chamber (11), the other side of the containing chamber (11) is concaved with curved pick-up slots (13) toward the interior of the containing chamber (11) to provide for a user to pick up the USB flash drives for use, a cable containing slot (14) is provided adjacent to the containing chamber (11) to accept a caps of the USB flash drives or other peripheral equipment, and the interior of the main unit (1) is provided with a wire collection device (not shown in the drawings) by which the USB flash drives can be accessed and a computer can be electrically interconnected;

a wallet unit (2) which includes a fixed panel (21), a side panel (22) and a movable panel (23) to enclose and cover the main unit (1), wherein the movable panel (23) is able to lift up, cover and close the containing chamber (11) of the main unit (1) to prevent from dropping of elements in the containing chamber (11), and the movable panel (23) is provided with a internal pocket (24) toward the containing chamber (11), allowing the user to put an index of contents of the flash drives or name cards;

a USB connector (3) which includes a connection cable (31) and is electrically interconnected with the wire collection device in the main unit (1) from the cable containing slot (14) through the connection cable (31); and a luminous element (4) which is electrically interconnected with the wire collection device, such that when the USB connector (3) is interconnected with the computer, the wire collection device can illuminate through the luminous element (4), so as to provide for identifying a state of connection and access from outside.

Figure 3:
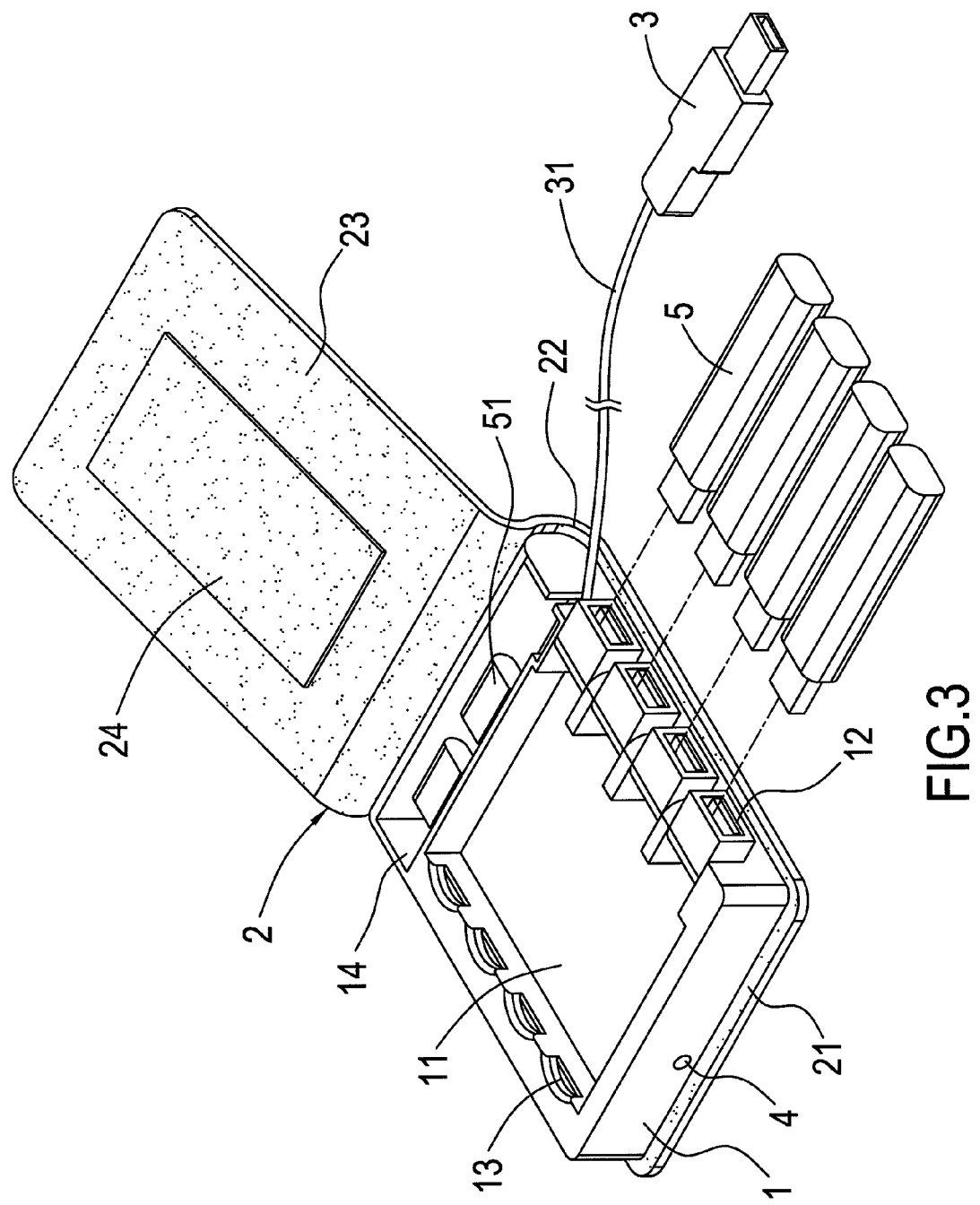
FIG. 3 shows a three-dimensional structural view of an implementation of USB flash drives for the multifunctional Universal Serial Bus flash drive organizer of the present invention.

Referring to FIG. 3, it shows a three-dimensional structural view of an implementation of USB flash drives for the multifunctional Universal Serial Bus flash drive organizer of the present invention. When the user is to operate the device, the user first electrically interconnects the USB connector (3) with the computer, turns the USB sockets (12) outward from the containing chamber (11), and then connects USB flash drives (5) with the USB sockets (12) that the USB flash drives (5) can be identified and accessed with the computer through the wire collection device. At this time, caps (51) which are detached from the USB flash drives (5) can be stored in the cable containing slot (14) of the main unit (1).

Particularly, for the multifunctional Universal Serial Bus flash drive organizer, the multiple USB flash drives can be all operated and used at a same time, and can be labeled for drive management and organization for ease of use and carrying.

Figure 4:
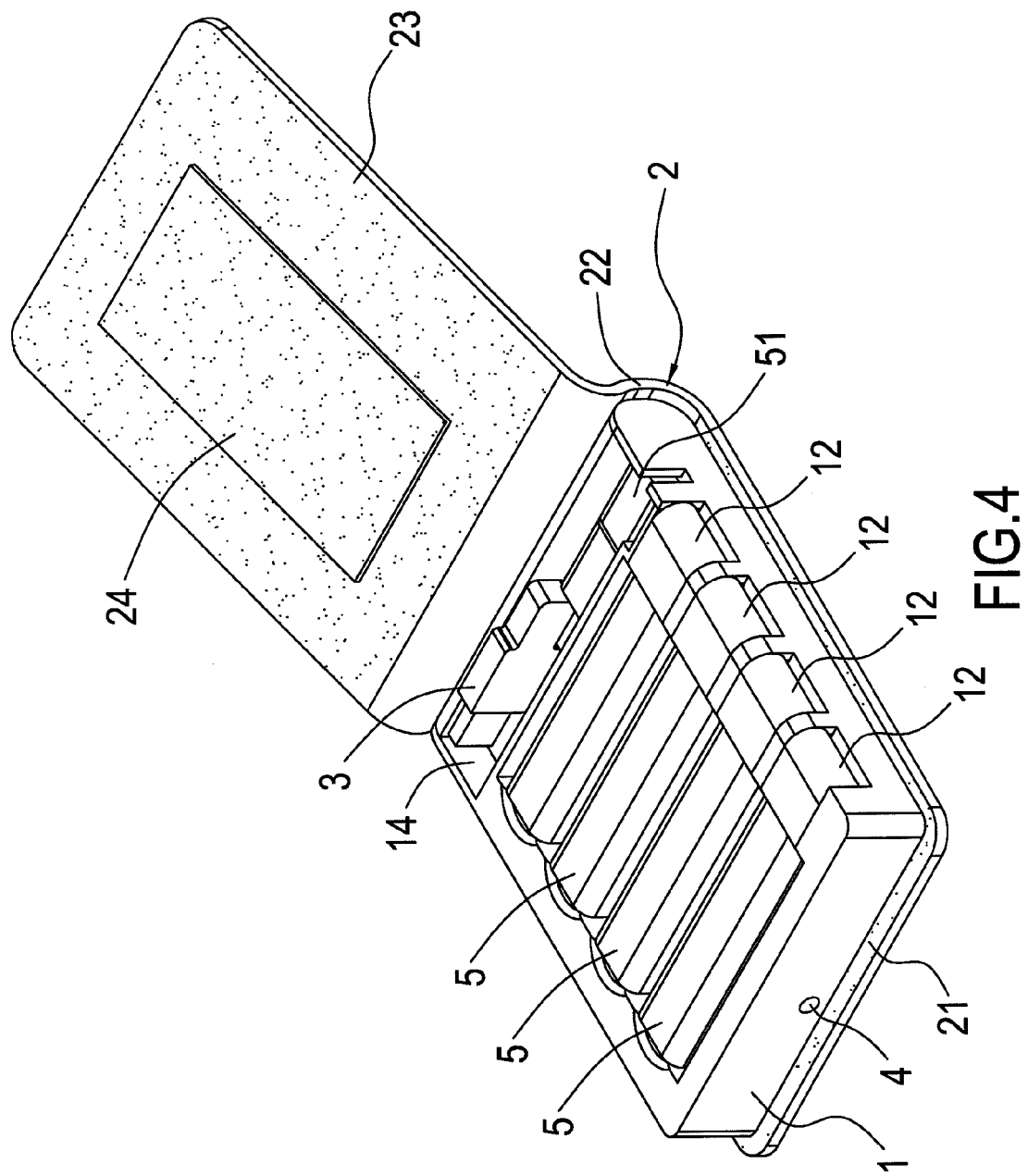
FIG. 4 shows a three-dimensional structural view of receiving the USB flash drives in the multifunctional Universal Serial Bus flash drive organizer of the present invention.
Figure 5:
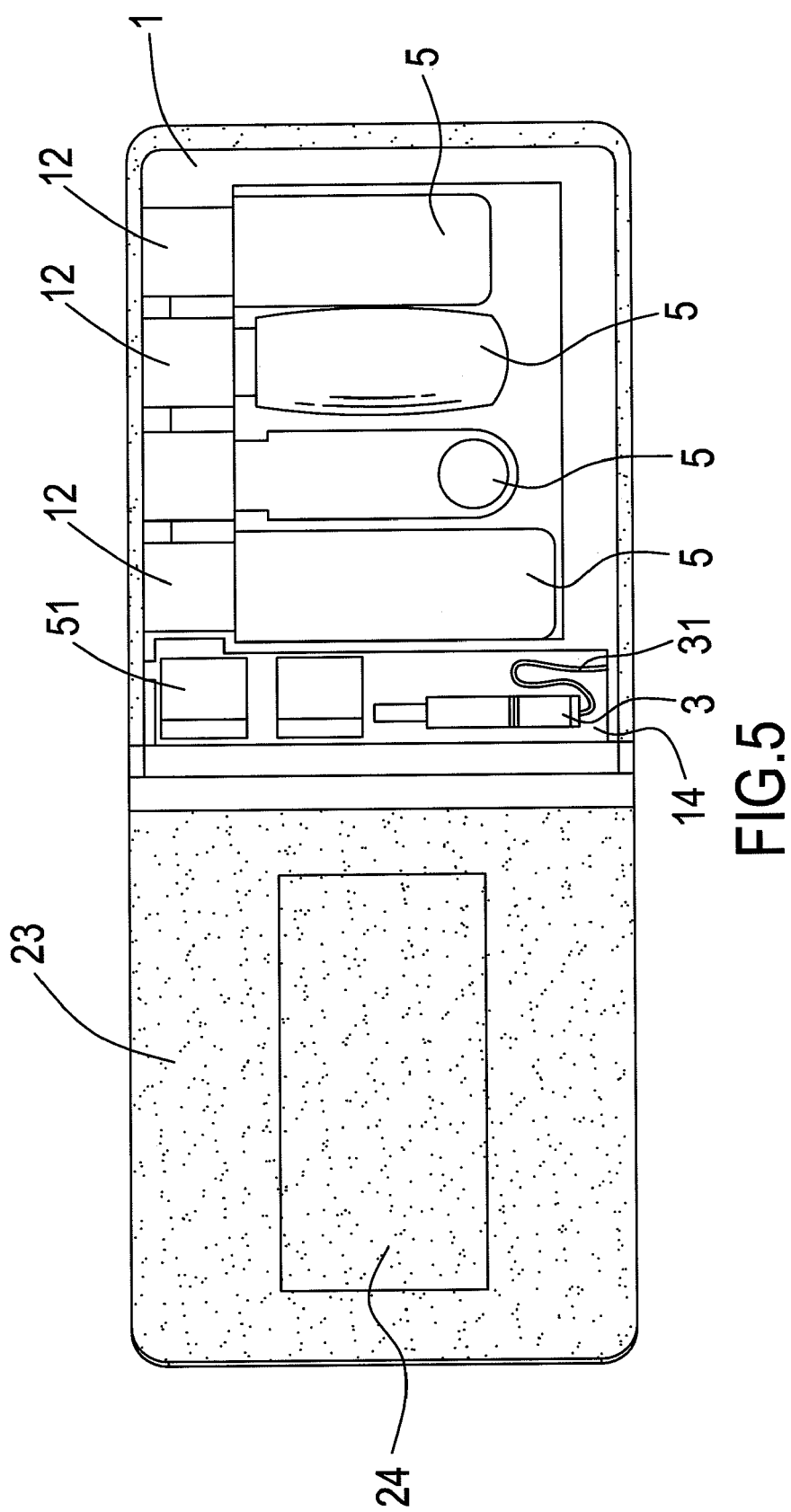
FIG. 5 shows a plan view of how the USB flash drives are received in the multifunctional Universal Serial Bus flash drive organizer of the present invention.

Referring to FIG. 4 and FIG. 5, they show a three-dimensional structural view and a plan view of how the USB flash drives are received in the multifunctional Universal Serial Bus flash drive organizer of the present invention. When the user stops using the organizer, it is not necessary for the user to remove the USB flash drives (5) but to turn the USB socket (12) directly toward the containing chamber (11), allowing the USB flash drives (5) to be put in the containing chamber (11). Next, the USB connector (3) and the connection cable (31) are stored in the cable containing slot (14) and then the movable panel (23) of the wallet unit (2) is closed to contain the USB flash drives (5), which achieves functions of easiness in labeling for management, convenience in carrying and protection as well as is provided with an orderly appearance.

Accordingly, as there are multiple USB sockets, when the user inserts normally several USB flash drives, the present invention can become a portable storage device allowing the user to integrate multiple drives to increase capacity. Various USB flash drives can be removed and inserted at any time.

It is of course to be understood that the embodiments described herein is merely illustrative of the principles of the invention and that a wide variety of modifications thereto may be effected by persons skilled in the art without departing from the spirit and scope of the invention as set forth in the following claims.

What is claimed is:

1. A multifunctional universal serial bus flash drive organizer comprising:
    a main unit, an interior of which is provided with a containing chamber, with a side of the containing space being pivoted with USB (Universal Serial Bus) sockets that the USB sockets turn on the containing chamber, a cable containing slot being provided beside the containing chamber and the interior of the main unit being provided with a wire collection device;
    a wallet unit which encloses the main unit to form a box to be carried easily; and
    a USB connector which includes a connection cable and is interconnected with the wire collection device through the connection cable, thereby being electrically interconnected with a computer and being contained in the cable containing slot.

2. The multifunctional universal serial bus flash drive organizer according to claim 1, wherein the main unit is provided with a luminous element which is electrically interconnected with the wire collection device, such that when the USB connector is interconnected with the computer, the wire collection device illuminates for identification through the luminous element.

3. The multifunctional universal serial bus flash drive organizer according to claim 1, wherein a side of the containing space is concaved with curved pick-up slots.

4. The multifunctional universal serial bus flash drive organizer according to claim 1, wherein the wallet unit includes a fixed panel, a side panel and a movable panel, with that the fixed panel is provided at a bottom of the main unit, the side panel is provided at a side of the main unit and the movable panel is provided at a top of the main unit to cover the containing chamber of the main unit and form a box.

5. The multifunctional universal serial bus flash drive organizer according to claim 4, wherein the movable panel of the wallet unit is provided with a internal pocket toward an inner surface of the containing chamber, allowing a user to put an index of contents of the flash drives or name cards.

6. The multifunctional universal serial bus flash drive organizer according to claim 1, wherein the USB sockets can turn 180° in the containing chamber.

* * * * *